(12) United States Patent
Strittmatter et al.

(10) Patent No.: US 11,747,391 B2
(45) Date of Patent: Sep. 5, 2023

(54) METHOD FOR DETECTING ERRORS OR MALFUNCTIONS IN ELECTRICAL OR ELECTRONIC COMPONENTS OF A CIRCUIT ARRANGEMENT

(71) Applicant: Endress+Hauser SE+Co. KG, Maulburg (DE)

(72) Inventors: Christian Strittmatter, Rickenbach (DE); Simon Gerwig, Schopfheim (DE); Michael Dötsch, Rickenbach (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 0 days.

(21) Appl. No.: 17/629,032

(22) PCT Filed: Jun. 18, 2020

(86) PCT No.: PCT/EP2020/066990
§ 371 (c)(1),
(2) Date: Jan. 21, 2022

(87) PCT Pub. No.: WO2021/013445
PCT Pub. Date: Jan. 28, 2021

(65) Prior Publication Data
US 2022/0317175 A1    Oct. 6, 2022

(30) Foreign Application Priority Data
Jul. 24, 2019 (DE) ...................... 10 2019 120 059.8

(51) Int. Cl.
*G01R 31/28* (2006.01)
*H05K 13/08* (2006.01)
*G01R 31/71* (2020.01)

(52) U.S. Cl.
CPC ..... *G01R 31/2813* (2013.01); *G01R 31/2829* (2013.01); *G01R 31/71* (2020.01); *H05K 13/081* (2018.08); *H05K 13/082* (2018.08)

(58) Field of Classification Search
CPC ............ G01R 31/2813; G01R 31/2818; G01R 31/2829; G01R 31/71; H05K 13/081; H05K 13/082
See application file for complete search history.

(56) References Cited

U.S. PATENT DOCUMENTS 6,614,253 B2 * 9/2003 Berkely ............. G01R 31/2812
324/762.01
6,937,004 B2 * 8/2005 Ohazama ............... H05K 3/361
324/762.04
(Continued)

FOREIGN PATENT DOCUMENTS

DE    102013214478 A1    1/2015
DE    102017222597 A1 *  6/2019
(Continued)

*Primary Examiner* — Vinh P Nguyen
(74) *Attorney, Agent, or Firm* — Mark A. Logan; Endress+Hauser (USA) Holding, Inc.

(57) ABSTRACT

A method for detecting errors or malfunctions in electrical or electronic components of circuits, wherein each of the circuits is located on a circuit board and wherein a plurality of circuit boards border one another on a circuit board panel, includes populating each of the circuit boards of the circuit board panel with electrical or electronic components corresponding to the circuits; for each of the analog, electrical or electronic components used for the construction of the circuits, placing a corresponding test component in an edge region of the circuit board panel; providing the analog, electrical or electronic test components placed in the edge region of the circuit board panel with test points; and checking for the correct function value and/or the correct poling of the analog, electrical or electronic test components (Continued)

provided with test points and located in the edge region of the circuit board panel.

6 Claims, 2 Drawing Sheets

(56) References Cited

U.S. PATENT DOCUMENTS

| 10,884,052 | B2 * | 1/2021 | Böhler | G01R 31/2808 |
| 11,221,360 | B1 * | 1/2022 | Thiel | H05K 1/0268 |

FOREIGN PATENT DOCUMENTS

| DE | 102017222597 | A1 | 6/2019 |
| EP | 2830400 | A1 | 1/2015 |

* cited by examiner

METHOD FOR DETECTING ERRORS OR MALFUNCTIONS IN ELECTRICAL OR ELECTRONIC COMPONENTS OF A CIRCUIT ARRANGEMENT

CROSS-REFERENCE TO RELATED APPLICATIONS

The present application is related to and claims the priority benefit of German Patent Application No. 10 2019 119 120 059.8, filed on Jul. 24, 2019 and International Patent Application No. PCT/EP2020/066990, filed on Jun. 18, 2020, the entire contents of which are incorporated herein by reference.

TECHNICAL FIELD

The invention relates to a method for detecting errors and/or malfunctions in electrical or electronic components of a circuit arrangement. Preferably, the method is used in connection with the production of circuit arrangements, which are applied in field devices of automation technology.

BACKGROUND

In process automation as well as in manufacturing automation, field devices are often applied for registering and/or influencing physical, chemical or biological process variables. Serving for registering process variables are measuring devices. Such are used, for example, for pressure- and temperature measurement, conductivity measurement, flow measurement, pH measurement, fill level measurement, etc. and register the corresponding process variables, pressure, temperature, conductivity, pH value, fill level, flow, etc. Used for influencing variables are actuator systems. Examples of actuators are pumps or valves, which can influence the flow of a liquid in a tube or pipe or the fill level in a container. Besides the above mentioned measuring devices and actuators, referred to as field devices are also remote I/Os, radio adapters, and, in general, devices, which are arranged at the field level. Referred to as field devices are, generally, devices, which are applied in the vicinity of a process or plant and which deliver, or process, process- or plant relevant information.

In order to be able to apply field devices of automation technology also in explosion endangered areas (gas and/or dust), the electrical or electronic components of the circuit arrangements of the field devices must be designed to meet the appropriate Ex-ignition protection type. This is especially true for components, which serve for analog signal conditioning. It needs to be assured that energy supply is always bounded such that any spark formation—also in the event of a malfunction—is effectively prevented. Such is assured by use of voltage- and electrical current limiting components. In order to obtain the required permits, are also capacitances, which are present at the connection terminals, are to be specified and limited.

In order to assure that the electrical or electronic components provided for limiting measures are effective, these are usually provided redundantly. In order to obtain the needed permits, it must, moreover, be proved by piece testing that the utilized components actually have the values, which are specified in the permit documents. For this, there occurs during manufacture a PPVS testing (Present, Polarity, Value, Solder). It is, thus, checked as follows: Are the correct components present? Is the polarity of the components correct? Have the components the right values? Are the components correctly soldered?

This testing requirement is usually met via an AOI (Automated Optical Inspection), which assures the presence of correct components and their correct soldering. If the solder sites are not visible to the AOI, then an AXI (Automated X-ray Inspection) is used with the AOI. An additional testing requirement is an electrical function test (e.g. an In Circuit Test—ICT), via which correct poling (when such is present) and correct values (voltage, electrical current, resistance) of each component are assured. In order to conduct the electrical function test, test points are provided on each of the components.

Disadvantageous with these test points is a space loss for the circuit components on the circuit board: due to the space requirements for the test points, the area available for the arrangement of components and conductive traces as well as for possibly required spacing regions is limited. As a result, it can happen that a circuit arrangement is not implementable in a desired form factor only because of the required test points.

SUMMARY

An object of the invention is to provide a simply and reliably performable method for detecting errors or malfunctions in electrical or electronic components of a circuit arrangement.

The object is achieved by a method for detecting errors or malfunctions in electrical or electronic components of equally composed circuit arrangements, wherein each of the circuit arrangements is located on a circuit board and wherein a plurality of circuit boards, each with an equally composed circuit arrangement, are provided bordering one another on a circuit board panel, wherein the method includes method steps as follows:

- populating each of the circuit boards of the circuit board panel with electrical or electronic components corresponding to the circuit arrangement;
- for each of the analog, electrical or electronic components used for the construction of the circuit arrangements, placing a corresponding test component in an edge region of the circuit board panel;
- providing the analog, electrical or electronic test components placed in the edge region of the circuit board panel with test points;
- checking for the correct function value and/or the correct poling of the analog, electrical or electronic test components provided with test points and located in the edge region of the circuit board panel.

Preferably, the circuit arrangement is so embodied that it is usable especially as a sensor- or actuator electronics or as a transmitter electronics for an automation field device.

In an advantageous embodiment of the method of the invention, it is assured that the different electrical or electronic test components placed in the edge region of the circuit board panel come, in each case, from the same batch, or from the same components roll, as the corresponding electrical or electronic components used on the circuit boards for the circuit arrangements. Therefore, it is provided that the electrical or electronic test components in the edge region of the circuit board panel are placed after the circuit boards have been completely populated with the electrical or electronic components of the circuit arrangement. In this way, especially splicing failures can be excluded during the production of the circuit board panel. A splicing failure can occur, for example, when a components roll with second components is erroneously connected to a components roll with first components, wherein the second components differ from the first components.

An advantageous, additional development of the method of the invention provides that a suitable test, for example, an In Circuit Test, is used as electrical test for checking for the different test components. In the electrical test, it is checked whether each of the electrical or electronic components on the panel edge has the specified value and whether the components are correctly poled.

Besides the checking of the correct value and, in given cases, the correct poling of the electrical or electronic components, there occurs according to another development of the method of the invention an optical inspection of the electrical or electronic components and the corresponding test components arranged on the circuit board panel. Applied is e.g. an Automated Optical Inspection (AOI) or other known method. Especially, it is checked, in such case, whether the required electrical or electronic components as well as the corresponding test components are present and whether their soldering has been correctly performed. Preferably in the testing, thus, two different tests are performed. On the one hand, an electrical test method is performed, in order to check the correct functioning of the electrical or electronic components. On the other hand, an optical test method, such as MOI, AOI and x-ray, is performed. By means of this method, the processing quality is judged and checked.

In connection with the invention, the optical inspection is performed on the circuit board panel; in contrast, it is sufficient that the electrical test be performed only for the test components arranged on the panel edge. These test components are especially components, which are relevant for satisfying the Ex safety requirements of field devices in automation technology. They can be, for example, resistances, Z-diodes, capacitors, etc. Preferably selected as test components and placed on the panel edge are, thus, electrical or electronic components, which guarantee safe use in the explosion endangered area. Only on these explosion endangered region qualified, electrical or electronic test components located in the edge region of the circuit board panel is the electrical test performed. The electrical test checks the value and, in given cases, the polarity of the test components. Since the test components are decoupled electrically from other components, the checking is simpler and better/safer to perform.

The previously required checking by means of an ICT tester is absent. This means naturally a considerable cost- and time saving.

The invention has, in summary, thus, a number of advantages:
a) reduced space requirement, especially in the case of Ex-assemblies/components, coupled with unchanged testing requirement. Thus with the solution of the invention and its embodiments, a significant number of test points on the circuit boards can be avoided. Now only the components electrically to be tested and located on the panel edge have test points. These are preferably analog components, which serve for assuring the explosion protection. Because of the space gained on the circuit board, the circuit board size can be reduced, this in turn reducing the production costs and helping in miniaturizing the circuit boards. Alternatively, a greater number of components can be placed on an unchanged area.
b) reduced testing effort. Thus the testing as regards the presence and correct soldering of each individual component on the circuit board panel occurs, for example, via AOI testing. This testing occurs via an optical method usually after the populating of the circuit boards. The correct value and, in given cases, the correct poling of the components on the panel edge is determined indirectly via a component measurement. According to the invention, the number of components to be measured is, thus, significantly decreased, since only the test components on the panel edge are tested. In such case, it is naturally also advantageous that a component type corresponding to a test component is present multiply on the circuit board panel, however, need be tested only once per circuit board panel.
c) lowered production costs. The test time—which is usually a complex and, thus, expensive method step—is significantly decreased.

In order that the method functions reliably, it needs to be assured that the components to be tested on the panel edge come from the same material roll as the corresponding components of the circuit arrangement on the circuit board panel. Therefore, the test components are applied in the edge region, when the components have already been populated on the corresponding circuit board panel.

BRIEF DESCRIPTION OF THE DRAWINGS

The invention will now be explained in greater detail based on the appended drawing, the figures of which show as follows.

DETAILED DESCRIPTION

Figure 1:
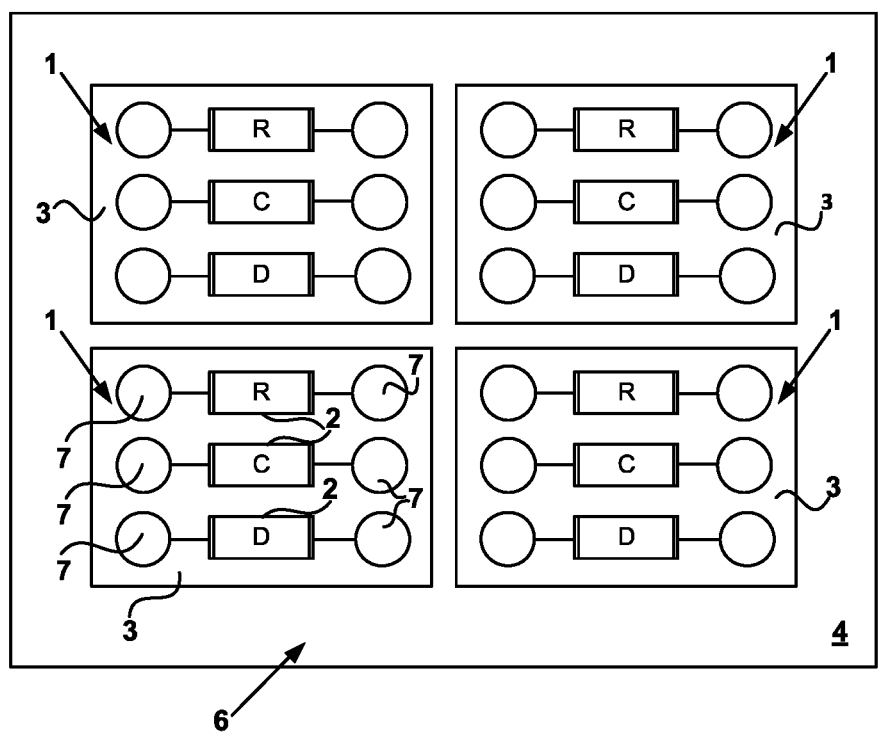
FIG. 1 shows a schematic view of a circuit board panel having a plurality of circuit boards and illustrating a solution known in the state of the art.

FIG. 1 shows a schematic view of a circuit board panel 4 having a plurality of circuit boards 3 and illustrating a method known in the state of the art. The same circuit arrangement 1 is implemented on each of the circuit boards 3 of the circuit board panel 4. Each of the circuit arrangements 1 is, for example, a circuit for analog signal conditioning of an automation field device. The circuit arrangement 1 is preferably so designed that it satisfies the requirements for use in an explosion endangered area.

Shown from the circuit arrangements 1 for illustrating the difference between the state of the art and the solution of the invention are only three analog components 2. Such are usually components of any circuit arrangement 1, which is applied in an explosion endangered area: a resistor R, a capacitor C and a diode D.

In order after terminating the populating of the circuit board panel 4 to be able to guarantee that the components 2 have the correct value and the capacitor C and the diode D have the correct poling, an electrical function test is executed. This electrical function test can occur with a multimeter or with a tester specially produced for the circuit arrangement 1. In order that the test can be performed, each of the components 2 of the circuit boards 3 must have two test points 7. As already described above, the test points 7 require space on the circuit boards 3. The disadvantages were already described above.

Figure 2:
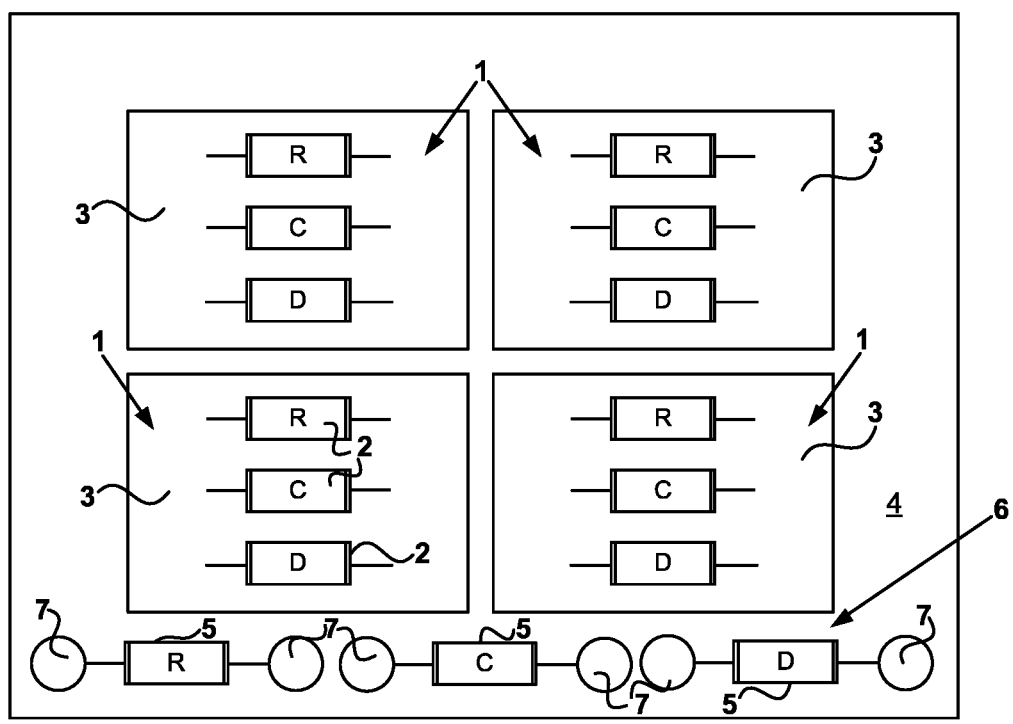
FIG. 2 shows a schematic view of a circuit board panel having a plurality of circuit boards and illustrating the method of the present disclosure.

FIG. 2 shows a schematic view of the circuit board panel 4 having a plurality of circuit boards 3 as described in FIG. 1 but modified to illustrate the method of the invention. The construction of the circuit arrangements 1 arranged on the circuit boards 3 of the circuit board panel 4 corresponds to the construction shown in FIG. 1. After positioning the components 2 of the circuit arrangements 1, they are, moreover, usually soldered directly to the surface of the circuit boards 3.

The components 2 arranged on the circuit boards 3 have no test points 7 in FIG. 2. For such purpose, test components 5 are provided in one of the edge regions 6 of the circuit board panel 4. Such are preferably placed after the populating of the components 2 on the circuit boards 3 of the circuit board panel 4—thus, at the end of the populating of the circuit board panel 4. In this way, it is assured that the test components come from the same components roll as the components 2 on the corresponding circuit board panel 4. If during the populating of the circuit board panel 4 a new components roll was spliced on, then by placing the test components on the panel edge after the populating of the circuit board panel, it is assured that the spliced components roll contains the correct components. The empty material roll was already tested in the case of the preceding circuit board panel. In the case of the solution of the invention, the electrical test is performed (automatically, semiautomatically or manually) only on the test components 5. If each of the test components 5 registers the correct value and, in given cases, the correct poling, then also each of the corresponding components 2 on the circuit board panel 4 has the correct value and, in given cases, the correct poling.

According to the invention, it is, thus, possible so to perform the testing of the components 2 of a circuit board panel 4 by means of a reduced number of test components 5 that the prescribed safety requirements for use of the circuit arrangements 1 in an explosion endangered area are satisfied.

In addition to the above described testing, the circuit board panels 4 with the circuit arrangements 1 are usually additionally subjected to an optical inspection. In such case, it is checked, whether all components 2 and test components 5, which should be present, are actually present, and whether their soldering, or securement, on the circuit boards 3 is correct.

The invention claimed is:

1. A method for detecting errors or malfunctions in electrical or electronic components of equally composed circuit arrangements, wherein each of the circuit arrangements is located on a circuit board and wherein a plurality of circuit boards, each with a respective equally composed circuit arrangement, are provided bordering one another on a circuit board panel, the method comprising:

populating each of the circuit boards of the circuit board panel with analog, electrical, or electronic components corresponding to the circuit arrangement;

for each of the analog, electrical, or electronic components used for the construction of the circuit arrangements, placing a corresponding test component in an edge region of the circuit board panel;

ensuring the analog, electrical, or electronic test components in the edge region of the circuit board panel come, in each case, from a same batch, or from a same components roll, as the corresponding electrical or electronic components used on the circuit boards for the circuit arrangements;

providing the analog, electrical, or electronic test components placed in the edge region of the circuit board panel with test points;

checking for a correct function value and/or a correct poling of the analog, electrical, or electronic test components provided with test points and located in the edge region of the circuit board panel.

2. The method as claimed in claim 1, wherein the analog, electrical, or electronic test components are placed in the edge region of the circuit board panel after the circuit boards have been completely populated with the analog, electrical, or electronic components of the circuit arrangement.

3. The method as claimed in claim 1, further comprising running a suitable test as an electrical test for checking the analog, electrical, or electronic test components.

4. The method as claimed in claim 3, wherein the analog, electrical, or electronic test components are designed for an explosion endangered area, and wherein the electrical test is performed on the analog, electrical, or electronic test components serving for the explosion endangered region and located in the edge region of the circuit board panel.

5. The method as claimed in claim 1, further comprising:

performing an optical inspection of the analog, electrical, or electronic components on the circuit boards of the circuit board panel and the corresponding test components arranged in the edge region the circuit board panel via an Automated Optical Inspection (AOI), wherein the AOI checks whether the required analog, electrical, or electronic components and the corresponding test components are present and whether their soldering has been correctly performed.

6. The method as claimed in claim 1, wherein the circuit arrangement is so embodied that it is usable as a sensor- or actuator electronics or as a transmitter electronics for an automation field device.

* * * * *